(12) United States Patent
Seeli et al.

(10) Patent No.: US 8,424,551 B2
(45) Date of Patent: Apr. 23, 2013

(54) HEAT TRANSFER APPARATUS AND METHOD

(75) Inventors: John W. Seeli, Peoria, IL (US); David Zietlow, Peoria, IL (US)

(73) Assignee: Bradley University, Peoria, IL (US)

( * ) Notice: Subject to any disclaimer, the term of this patent is extended or adjusted under 35 U.S.C. 154(b) by 1412 days.

(21) Appl. No.: 12/022,673

(22) Filed: Jan. 30, 2008

(65) Prior Publication Data

US 2008/0178936 A1 Jul. 31, 2008

Related U.S. Application Data

(60) Provisional application No. 60/898,337, filed on Jan. 30, 2007.

(51) Int. Cl.
*F28F 9/02* (2006.01)
*F17D 1/20* (2006.01)

(52) U.S. Cl.
USPC .............................. 137/2; 165/173; 165/174

(58) Field of Classification Search ................ 137/597, 137/1, 2; 165/173, 174
See application file for complete search history.

(56) References Cited

U.S. PATENT DOCUMENTS

| | | | |
|---|---|---|---|
| 2,295,087 A | 9/1942 | Kleucker | |
| 3,990,063 A | 11/1976 | Schuman | |
| 3,990,069 A | 11/1976 | Schuman | |
| 4,349,440 A * | 9/1982 | Esmond | 165/175 |
| 4,511,432 A | 4/1985 | Sephton | |
| 4,553,401 A | 11/1985 | Fisher | |
| 4,569,390 A | 2/1986 | Knowlton | |
| 4,600,053 A | 7/1986 | Patel | |
| 4,842,055 A | 6/1989 | Ohtsu | |
| 4,951,478 A | 8/1990 | McDonald | |
| 4,971,145 A * | 11/1990 | Lyon | 165/906 |
| 5,081,847 A | 1/1992 | Anderson | |
| 5,090,259 A | 2/1992 | Shishido | |
| 5,101,891 A | 4/1992 | Kadle | |
| 5,107,923 A | 4/1992 | Sherman | |
| 5,170,638 A | 12/1992 | Koenig | |
| 5,205,131 A | 4/1993 | Powlas | |
| 5,241,839 A | 9/1993 | Huges | |
| 5,242,016 A | 9/1993 | Voss | |
| 5,313,804 A | 5/1994 | Kaye | |
| 5,388,419 A | 2/1995 | Kaye | |
| 5,901,750 A | 5/1999 | Kozinski | |
| 5,946,927 A | 9/1999 | Dieckmann | |

(Continued)

FOREIGN PATENT DOCUMENTS

| | | |
|---|---|---|
| JP | A-2006-029689 | 2/2006 |
| WO | 2006/083442 | 8/2006 |

(Continued)

OTHER PUBLICATIONS

ISR issued Jul. 7, 2008, in conjunction with PCT/US2008/052473.

(Continued)

*Primary Examiner* — Kevin Lee
(74) *Attorney, Agent, or Firm* — Kutak Rock LLP; Marcellus A. Chase (57) ABSTRACT

A heat transfer apparatus and related methods are provided. The heat transfer apparatus and related methods more evenly distribute fluid flow in two-phase heat exchange systems by restricting fluid flow to one or more tube.

12 Claims, 12 Drawing Sheets

U.S. PATENT DOCUMENTS

| | | | |
|---|---|---|---|
| 6,032,470 | A | 3/2000 | Haselden |
| 6,109,047 | A | 8/2000 | Cowans |
| 6,155,075 | A | 12/2000 | Hanson |
| 6,318,118 | B2 | 11/2001 | Hanson |
| 6,338,383 | B1 | 1/2002 | Abdulnour |
| 6,364,006 | B1 | 4/2002 | Halt |
| 6,418,954 | B1 | 7/2002 | Taylor |
| 6,422,264 | B2 | 7/2002 | Ohmi |
| 6,442,953 | B1 | 9/2002 | Trigiani |
| 6,488,078 | B2 | 12/2002 | Beutler |
| 6,494,253 | B2 | 12/2002 | Gotou |
| 6,571,866 | B2 | 6/2003 | AbdulNour |
| 6,575,227 | B1 | 6/2003 | Leeson |
| 6,612,367 | B2 | 9/2003 | AbdulNour |
| 6,688,137 | B1 | 2/2004 | Gupte |
| 6,698,509 | B2 | 3/2004 | Rong |
| 6,732,538 | B2 | 5/2004 | Trigiani |
| 6,745,794 | B2 | 6/2004 | Gajewski |
| 6,766,260 | B2 | 7/2004 | Ambrosina et al. |
| 6,796,374 | B2 | 9/2004 | Rong |
| 6,863,120 | B2 | 3/2005 | Hwang |
| 6,892,805 | B1 | 5/2005 | Valensa |
| 7,000,427 | B2 | 2/2006 | Mathias |
| 7,055,576 | B2 | 6/2006 | Fernstrum |
| 7,080,524 | B2 | 7/2006 | Wiggs |
| 7,086,249 | B2 | 8/2006 | Bae et al. |
| 7,143,774 | B2 | 12/2006 | Lull et al. |
| 7,146,290 | B2 | 12/2006 | Trigiani |
| 7,200,530 | B2 | 4/2007 | Brown et al. |
| 7,203,881 | B1 | 4/2007 | Williams |
| 7,207,383 | B2 | 4/2007 | Hurst et al. |
| 7,240,694 | B2 | 7/2007 | Johnsen et al. |
| 2002/0038856 | A1 | 4/2002 | Jorgen |
| 2004/0079516 | A1 | 4/2004 | Leeson |
| 2004/0187928 | A1 | 9/2004 | Ambrosina |
| 2006/0137870 | A1 | 6/2006 | Ohhashi et al. |
| 2007/0163277 | A1 | 7/2007 | Tamura |
| 2007/0168084 | A1 | 7/2007 | Cheng |
| 2007/0169491 | A1 | 7/2007 | Cowans |

FOREIGN PATENT DOCUMENTS

| | | |
|---|---|---|
| WO | 2006/083448 | 8/2006 |
| WO | 2006/083450 | 8/2006 |
| WO | WO 2006/083442 | 8/2006 |

OTHER PUBLICATIONS

Paliwoda, A. (1992) "Generalized Method of Pressure Drop Calculation Across Pipe Components Containing Two-Phase Flow of Refrigerants". International Journal of Refrigeration. vol. 15, No. 2, p. 119-125.

Watanabe, M., Katsuta, M. and Nagata, K. (1995) Two-phase flow distribution in multi-pass tube modeling serpentine type evaporator, Proceedings of the ASME/JSME Thermal Engineering Conference, 2, p. 35-42.

Campagna, Michael 2001, An Evaporator Model which accounts for the Mal-distribution of Refrigerant applied to evaluate the Performance of Inlet Manifold Flow Distributors, Masters Thesis, Bradley University.

Zietlow, David; Campagna, Michael and Dias, John, 2002, Innovative Experimental Apparatus to Measure Liquid Flow Distribution in Two-Phase Flow Occurring in the Manifolds of Compact Heat Exchangers, HI-02-1-1, ASHRAE 2002 Annual Meeting.

\* cited by examiner

Figure 3. Section B-B

Figure 4. Mal-distributed Flow Pattern

Figure 5. Standard Deviation of Flow without Restriction as a Function of Cooling Load Figure 6. Standard Deviation of Flow without Restriction as a Function of Quality

Figure 7.

Standard Deviation of Flow without Restriction as a Function of Water Mass Flow Rate Figure 8. Standard Deviation of Flow with Restriction as a Function of Cooling Load Figure 9. Standard deviation of Flow with Restriction as a Function of Quality Figure 10. Standard deviation of Flow with Restriction as a Function of Water Flow Rate Figure 11. Reduction of Pressure Drop in Manifold Due to Restriction

Figure 12.

Flowchart for Predicting the area ratio of tubes- The Design Tool

Figure 13. Loss Coefficient as a Function of Valve Position

HEAT TRANSFER APPARATUS AND METHOD

CROSS-REFERENCE TO RELATED APPLICATIONS

This application claims priority pursuant to 35 U.S.C. 119 (e) to U.S. Provisional Patent Application Ser. No. 60/898,337, filed Jan. 30, 2007, the entire disclosure of which is incorporated herein by reference.

FIELD OF THE INVENTION

The present invention relates generally to heat exchange systems. More specifically, the present invention is concerned with (1) methods to optimize flow in two-phase heat exchange systems and (2) devices and methods that incorporate restricted flow tubes to optimize even fluid flow in two-phase systems.

BACKGROUND OF THE INVENTION

References

The following references are cited by number throughout this disclosure and provide general background information. Applicant makes no statement, inferred or direct, regarding the status of these references as prior art. Applicant reserves the right to challenge the veracity of statements made in these references, which are incorporated herein by reference.
1. Chisholm, D. (1983) *Two-Phase Flow in Pipes and Heat Exchangers*. George Godwin/Institution of Chemical Engineers, London. 1-24, 106-113, 123-128.
2. Paliwoda, A. (1992) "Generalized Method of Pressure Drop Calculation Across Pipe Components Containing Two-Phase Flow of Refrigerants". International Journal of Refrigeration. Vol 15, No. 2, p. 119-125.
3. Watanabe, M., Katsuta, M. and Nagata, K. (1995) Two-phase flow distribution in multi-pass tube modeling serpentine type evaporator, Proceedings of the ASME/JSME Thermal Engineering Conference, 2, p. 35-42.
4. Campagna, Michael 2001, An Evaporator Model which accounts for the Mal-distribution of Refrigerant applied to evaluate the Performance of Inlet Manifold Flow Distributors, Masters Thesis, Bradley University.

Two-phase flow, which is flow of fluids in a liquid phase and a vapor or gas phase, is encountered extensively in the air-conditioning, heating, and refrigeration industries. In order to avoid uneven refrigerant distribution in evaporator manifolds, the behavior of tubes and manifolds with two-phase flow needs to be understood. With even distribution of refrigerant in tubes, the size of the evaporator can be reduced while maintaining cooling capacity and compressor power consumption. This reduces the initial cost of the system without changing its performance. Uneven distribution of liquid is the main factor preventing micro-channel heat exchangers from replacing plate-fin and fin and tube heat exchangers in most applications. Micro-channel heat exchangers typically have 20% more heat exchanger area for the same package volume compared to plate-fin heat exchangers.

Campagna (reference 4) worked on simulating the uniform, evenly distributed flow of liquid in the manifold using parallel perforated plates, inserted into the manifold, supported by two threaded rods. One disadvantage to inserting flow distribution plates into the manifold is that it does not allow for easy access and adjustment over the course of time and usage. What is needed is a device and/or method to alter the flow of fluid in a heat exchanger to be more evenly distributed, that can be easily and quickly adjusted without disassembling the heat transfer apparatus.

SUMMARY OF THE INVENTION

An object of the instant invention is to provide a heat transfer apparatus and method. Another object of the instant invention is to provide a more efficient heat transfer device and method that more evenly distributes the flow of fluid. Still another object of the instant invention is to provide a method of modeling the optimization of heat transfer efficiency.

Objects of the instant invention are accomplished through the use of a heat transfer apparatus comprising a manifold and a plurality of tubes extending from the manifold. In a preferred embodiment, the manifold comprises an inlet and a plurality of mini heat exchanger channels connected to the inlet, wherein each mini heat exchanger channel is operably connected to a tube. In a preferred embodiment at least one tube comprises a fluid flow restrictor. In other preferred embodiments, each of the tubes includes a fluid flow restrictor. The fluid flow restrictors of the instant invention are not limited to a particular means or structure, but non-limiting examples in some configurations include: a tube restrictor valve; a tube crimp or a restriction tube segment (such as a reducer coupler, wherein the restriction tube segment has an inside diameter smaller than the inside diameter of a tube with no fluid flow restrictor). The instant invention allows the flow of fluid to be more evenly distributed among the plurality of tubes than a heat transfer apparatus with no fluid flow restrictor. If each of the tubes of the instant invention are restricted to its respective preferred predetermined amount, the flow of fluid is generally evenly distributed among the tubes, resulting in a more efficient transfer of heat. In preferred embodiments, the flow of fluid is about equally distributed among the tubes. In preferred embodiments, the fluid is liquid, vapor or some combination of both liquid and vapor. In some embodiments, the fluid is a refrigerant.

Objects of the instant invention are also accomplished through a method of improving the efficiency of heat transfer comprising restricting the flow of fluid in at least one tube of a heat transfer apparatus to a predetermined amount. In some embodiments of the instant invention the predetermined amount of flow is a function of the position of the tube along the manifold relative to a fluid inlet position of the manifold. In some embodiments, the flow of fluid is restricted in each of the tubes of the heat transfer apparatus. The restriction of fluid flow is not limited to a particular method, means or structure, but non-limiting examples in some configurations include, restricting fluid flow using a tube restrictor valve, a tube crimp or a restriction tube segment (such as a reducer coupler, wherein the restriction tube segment has an inside diameter smaller than the inside diameter of a tube with no fluid flow restrictor). If only one of the tubes of the instant invention is restricted, it allows the flow of fluid to be more evenly distributed among the plurality of tubes than a heat transfer apparatus with no fluid flow restrictor. If each of the tubes of the instant invention are restricted to its respective preferred predetermined amount, the flow of fluid is generally evenly distributed among the tubes, resulting in a more efficient transfer of heat. In preferred embodiments, the flow of fluid is about equally distributed among the tubes. In preferred embodiments the fluid is liquid, vapor or some combination of both liquid and vapor. In some embodiments, the fluid is a refrigerant.

Objects of the instant invention are also accomplished through a method of modeling the optimization of heat transfer efficiency of a two-phase heat transfer apparatus, the apparatus comprising a manifold and a plurality of tubes extending from the manifold. The method includes the steps of estimating sudden expansion two-phase pressure drop at an inlet of the manifold; predicting the two-phase pressure drop across tubes of the manifold; determining parameters for each tube of the apparatus related to an uneven fluid flow distribution; determining parameters for each tube related to an even flow distribution; and determining a preferable restriction cross-sectional area of each tube. In some embodiments, the apparatus further comprises a fluid flow restrictor connected to at least one of the plurality of tubes, and the method further comprises the steps of calibrating a dimensionless position of each fluid flow restrictor to a restriction cross-sectional area of each respective tube; and determining zero offset values. In some embodiments, the method further comprises restricting the cross-sectional area of at least one tube to the preferable restriction cross-sectional area. In other embodiments, the method further comprises restricting the cross-sectional area of each tube to each tube's respective preferable restriction cross-sectional area. The restriction of fluid flow is not limited to a particular method, means or structure, but non-limiting examples in some configurations include, restricting fluid flow using a tube restrictor valve, a tube crimp or a restriction tube segment (such as a reducer coupler, wherein the restriction tube segment has an inside diameter smaller than the inside diameter of a tube with no fluid flow restrictor). If only one of the tubes of the instant invention is restricted, it allows the flow of fluid to be more evenly distributed among the plurality of tubes than a heat transfer apparatus with no fluid flow restrictor. If each of the tubes of the instant invention are restricted to its respective preferred predetermined amount, the flow of fluid is generally evenly distributed among the tubes, resulting in a more efficient transfer of heat. In preferred embodiments, the flow of fluid is about equally distributed among the tubes. In preferred embodiments the fluid is liquid, vapor or some combination of both liquid and vapor. In some embodiments, the fluid is a refrigerant.

The foregoing and other objects are intended to be illustrative of the invention and are not meant in a limiting sense. The skilled artisan can readily deploy in the practice of this invention alternative methods for controlling the flow of liquid in one or more tubes to affect the more even distribution of liquid across the tubes of the manifold to attain more efficient heat transfer of a two-phase heat transfer apparatus. Many possible embodiments of the invention may be made and will be readily evident upon a study of the following specification and accompanying drawings comprising a part thereof. Various features and subcombinations of invention may be employed without reference to other features and subcombinations. Other objects and advantages of this invention will become apparent from the following description taken in connection with the accompanying drawings, wherein is set forth by way of illustration and example, an embodiment of this invention and various features thereof.

BRIEF DESCRIPTION OF THE DRAWINGS

A preferred embodiment of the invention, illustrative of the best mode in which the applicant has contemplated applying the principles, is set forth in the following description and is shown in the drawings and is particularly and distinctly pointed out and set forth in the appended claims.

DETAILED DESCRIPTION OF A PREFERRED EMBODIMENT

As required, several detailed embodiments of the present inventive concept are disclosed herein; however, it is to be understood that the disclosed embodiments are merely exemplary of the principles of the inventive concept, which may be embodied in various forms. Therefore, specific structural and functional details disclosed herein are not to be interpreted as limiting, but merely as a basis for the claims and as a representative basis for teaching one skilled in the art to variously employ the present inventive concept in virtually any appropriately detailed structure.

Figure 1:
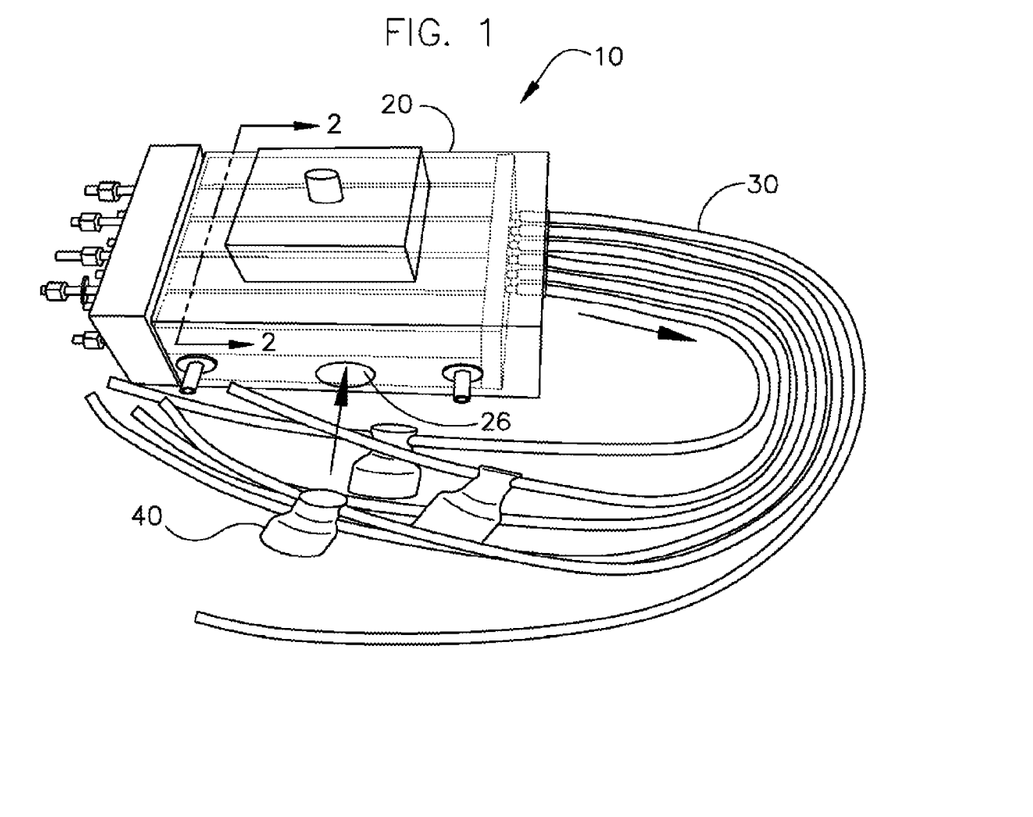
FIG. 1 shows a heat transfer apparatus of a first embodiment of the instant invention.

Referring to FIG. 1, a heat transfer apparatus (10) of one embodiment of the instant invention is shown. The apparatus (10) of FIG. 1 includes a manifold (20) with a fluid inlet (26) operably connected to heat exchanger channels (22) and six tubes (30) extending from the manifold (20). Some of the tubes (30) include a tube restrictor valve (40). Fluid flows from the inlet (26), through a manifold chamber (24), through the heat exchanger channels (22), and out through the tubes (30).

Restricting the tubes improves the uniformity of the mass distribution between heat exchanger tubes. This was demonstrated experimentally as is discussed in further detail below with respect to FIGS. 1-11 and 13. Two heat transfer devices were built and tested. A first heat transfer apparatus (10), shown in FIGS. 1-3, included six tubes (30) extending from the manifold (20). The second heat transfer apparatus included 20 tubes extending from the manifold. Flow distribution was measured according to standard deviation of liquid mass flow through the tubes. Flow distribution was compared for the heat transfer devices with no fluid flow restrictors versus the same two heat transfer devices with a pinch valve on each of the tubes, with the pinch valve set to a predetermined preferred restriction cross-sectional area. The predetermined preferred restriction cross-sectional area was determined using an embodiment of a method of modeling the optimization of heat transfer efficiency of a two-phase heat transfer apparatus of the instant invention, as is further discussed below with respect to the flow chart of FIG. 12. The efficiency of the heat transfer devices was improved as the fluid flow was more evenly distributed by using the pinch valves. The amount of improvement varied from case to case, but in this example, the average standard deviation of unrestricted flow was reduced dramatically from 9.09 [kg/hr] to 0.26 [kg/hr] when the tubes were restricted. Second, at equal mass flow rates in situations where the flow is more evenly distributed, the pressure drop through the manifold was reduced.

Figure 2:
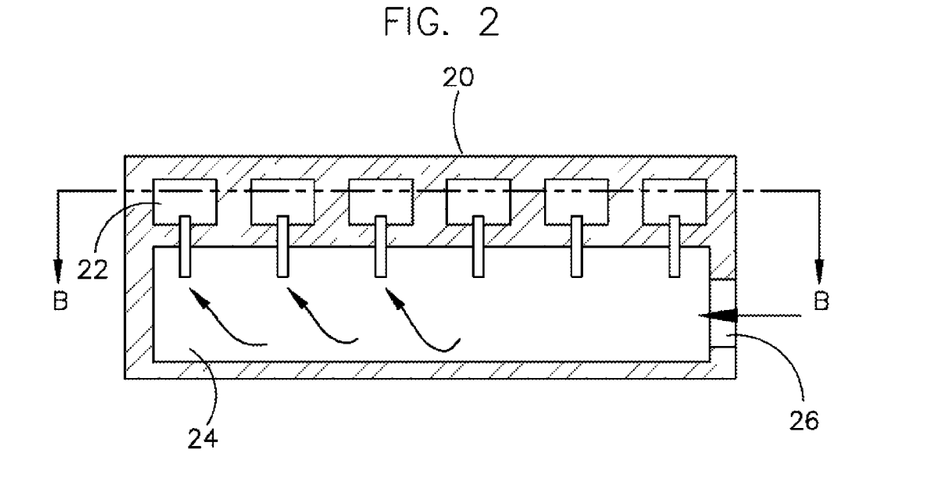
FIG. 2 shows a cross-section of the heat transfer apparatus of FIG. 1 along the line 2-2 shown in FIG. 1.
Figure 3:
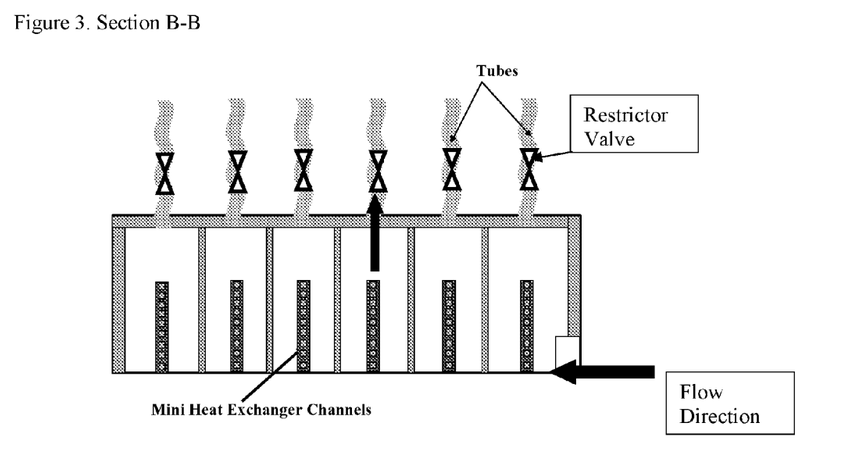
FIG. 3 shows a cross-section of the heat transfer apparatus of FIG. 1 along the line B-B shown in FIG. 2.
Figure 4:
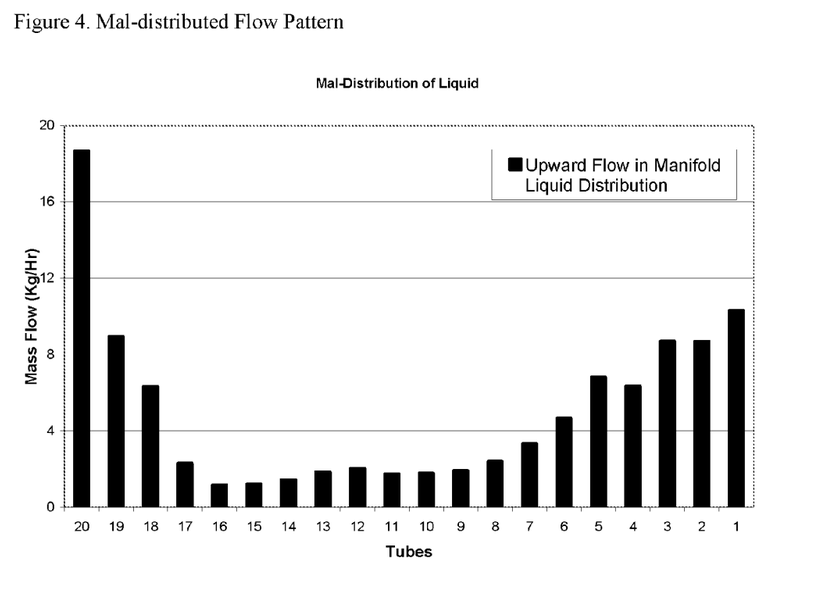
FIG. 4 shows an uneven distribution pattern of a heat transfer apparatus of the prior art.

There are many forces (inertial, gravitational, friction, etc.) within conventional heat exchanger geometries which direct more liquid to enter some heat exchanger tubes over others. To counter act these forces an additional restriction is applied to the tubes where there is excess liquid flow. Rather than placing an insert in the manifold, as taught by Campagna (reference 4) each tube of an evaporator was equipped with a tube restrictor valve (40), also called a pinch valve, as shown in FIGS. 1 to 3. When the valves (40) were properly adjusted, liquid mass flow was about evenly distributed among the tubes. FIG. 4 shows the uneven distribution flow pattern of the heat transfer apparatus with 20 tubes, wherein none of the tubes include a fluid flow restrictor.

Figure 5:
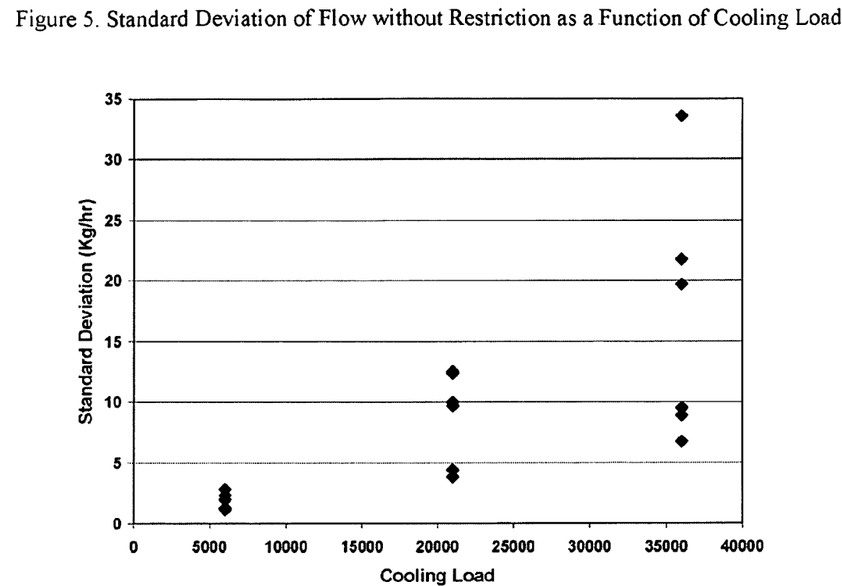
FIG. 5 shows empirically measured standard deviation of flow through a heat transfer apparatus of the prior art as a function of cooling load.
Figure 6:
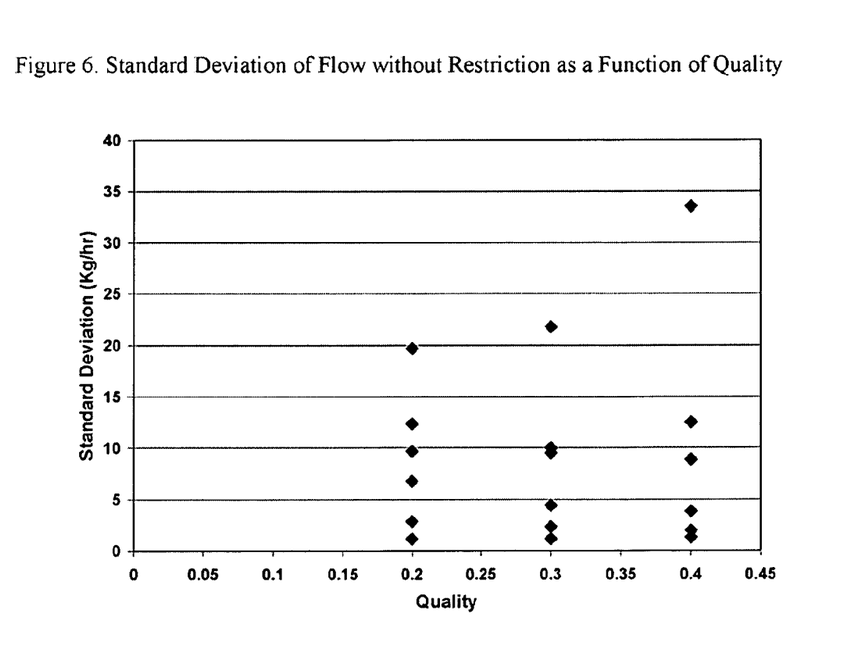
FIG. 6 shows empirically measured standard deviation of flow through a heat transfer apparatus of the prior art as a function of refrigerant quality.
Figure 7:
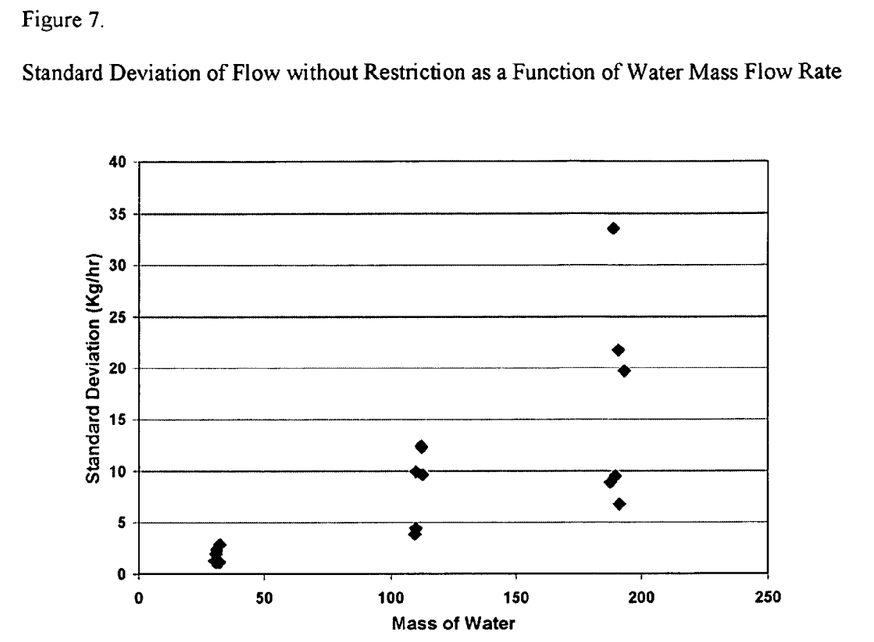
FIG. 7 shows empirically measured standard deviation of flow through a heat transfer apparatus of the prior art as a function of water mass flow rate.

The measure of non-uniformity of the flow distribution was quantified using the statistical measure of standard deviation. A standard deviation value of zero indicates that the distribution of flow was uniform. The larger the standard deviation the greater is the mal-distribution of liquid among the tubes. In the unrestricted case, depicted in FIG. 4, the distribution is uneven. In horizontal manifolds with upward flow in the tubes, the tubes farthest from the inlet received high liquid flow rate. The non-uniformity of flow distribution when the tubes are not restricted is very high. The average standard deviation for all experiments was 9.09 [kg/hr]. FIGS. 5, 6 and 7 depict empirically measured standard deviation of flow distribution through a heat transfer apparatus, without any fluid flow restrictor, as a function of cooling load, quality and liquid mass flow rate, respectively.

Figure 8:
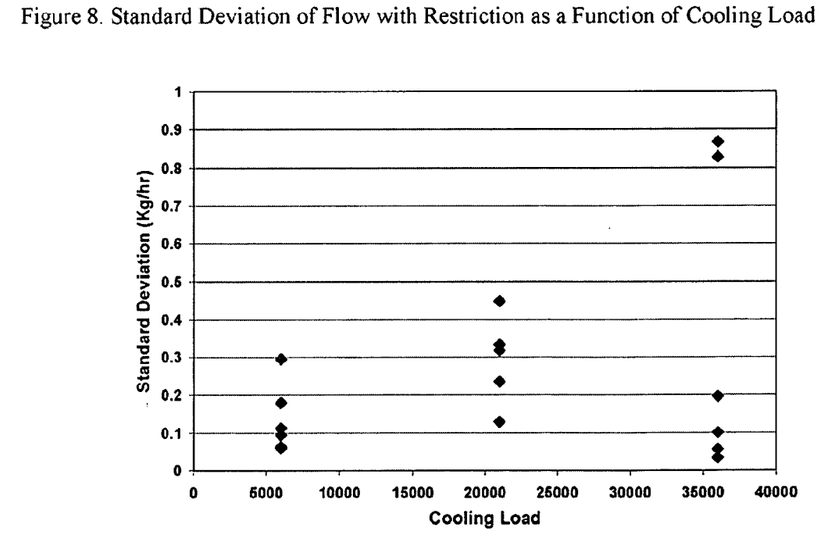
FIG. 8 shows empirically measured standard deviation of flow through a heat transfer apparatus of an embodiment of the instant invention as a function of cooling load.
Figure 9:
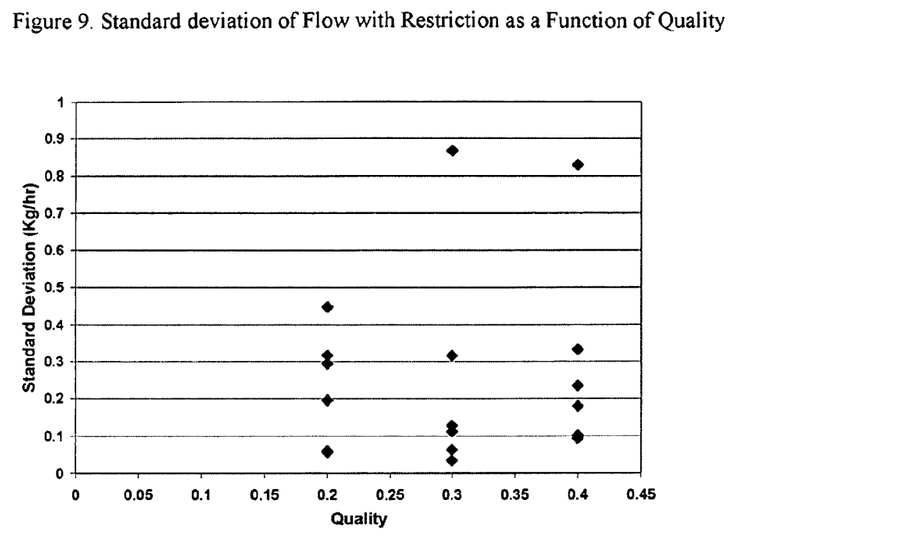
FIG. 9 shows empirically measured standard deviation of flow through a heat transfer apparatus of an embodiment of the instant invention as a function of refrigerant quality.
Figure 10:
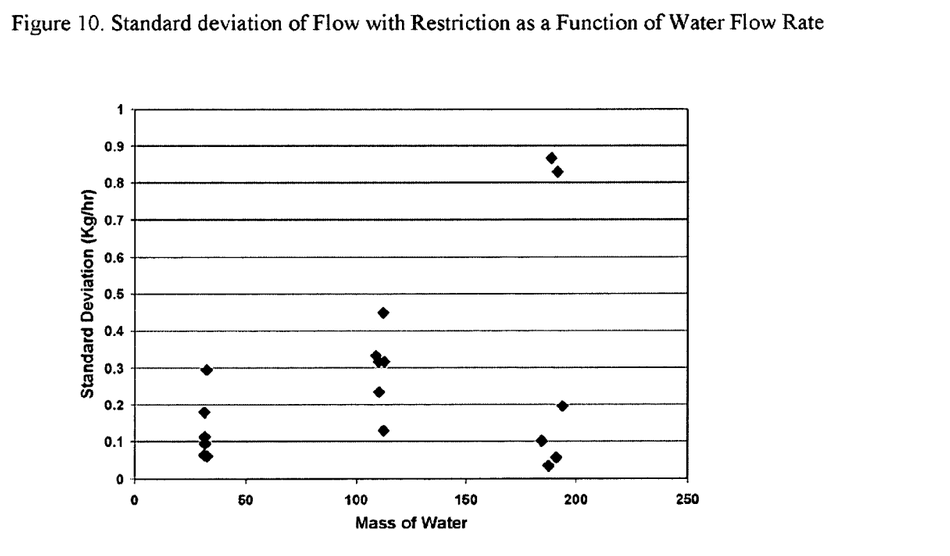
FIG. 10 shows empirically measured standard deviation of flow through a heat transfer apparatus of an embodiment of the instant invention as a function of water mass flow rate.

For the same flow rates of air and water, the experiments were conducted restricting the tubes by using flow restriction valves. For each tube, a preferable restriction cross-sectional area was determined using an embodiment of a method of modeling the optimization of heat transfer efficiency of a two-phase heat transfer apparatus of the instant invention, as is further discussed below with respect to the flow chart of FIG. 12. The tubes were restricted to the predetermined amounts. The standard deviation of the liquid mass fraction was drastically reduced, indicating more uniform flow distribution. The distribution of flow after restricting the tubes with valves was greatly improved. The average standard deviation for all experiments in even flow case is drastically reduced to 0.26 [kg/hr]. The non uniformity of liquid mass flow rates in 90% of the tubes were within +/−10%. FIGS. 8, 9 and 10 depict empirically measured standard deviation of flow distribution through a heat transfer apparatus, with pinch valves set to the predetermined preferred restriction cross-sectional area on each tube, as a function of cooling load, quality and liquid mass flow rate, respectively.

Figure 11:
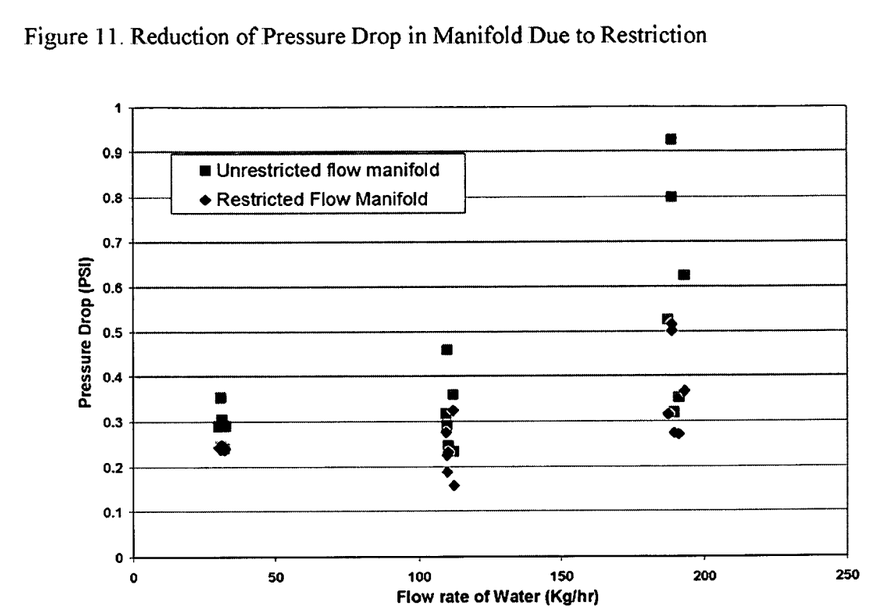
FIG. 11 shows empirically measured pressure drop in the manifold of a heat transfer apparatus of an embodiment of the instant invention compared with that of the prior art as a function of water mass flow rate.

FIG. 11 depicts empirically measured pressure drop in the manifold of a heat transfer apparatus with and without a fluid flow restrictor as a function of water mass flow rate. FIG. 11 shows that the pressure drop in the manifold decreases for restricted flow compared to the unrestricted flow.

Figure 12:
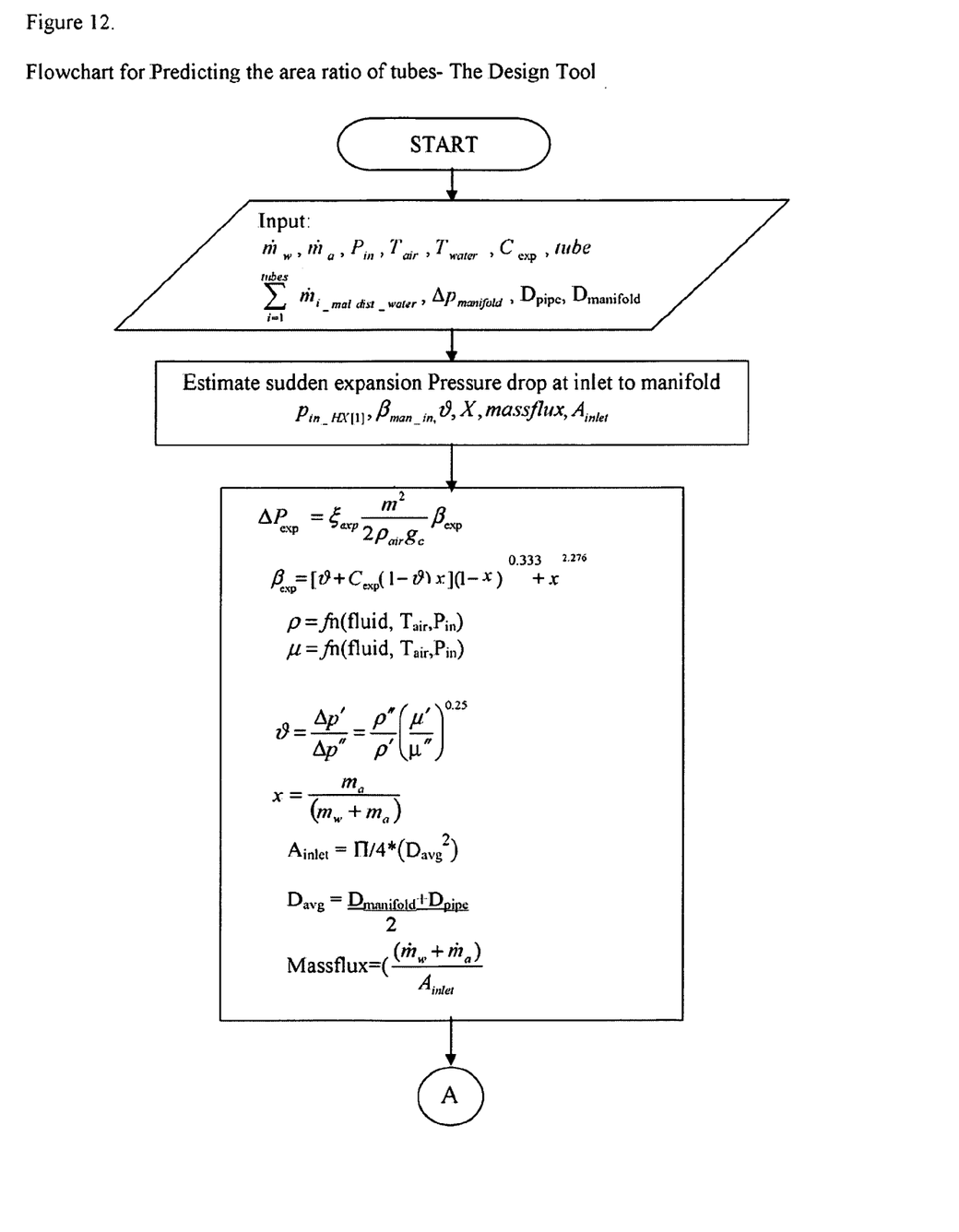
FIGS. 12, 12-A, 12-B, 12-C and 12-D show a flowchart for a method of predicting the cross sectional restriction area of tubes of a heat exchanger of a preferred embodiment of the instant invention.
Figure 13:
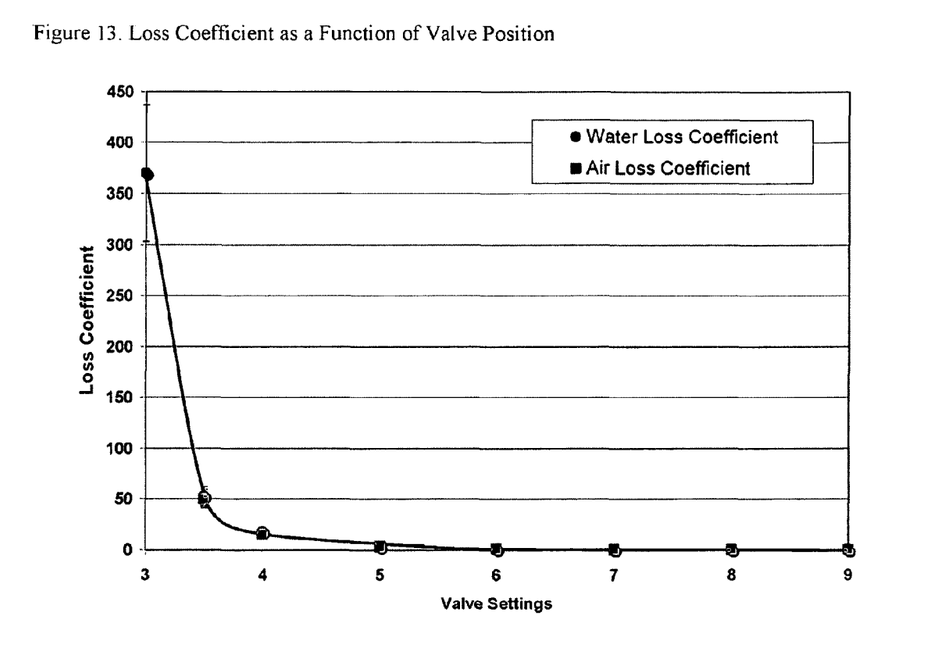
FIG. 13 shows empirically measured water and air loss coefficients as a function of dimensionless valve settings that have been correlated to predetermined cross-sectional restriction areas.

In this example, it was necessary to develop a computer design tool to determine a preferable restriction cross-sectional area for a tube. FIG. 12 depicts a flowchart for predicting the cross sectional restriction area of tubes. FIGS. 12-A, 12-B, 12-C and 12-D are continuations of the flowchart of FIG. 12. The design tool was validated using pinch valves on tubes where air and water simulated two-phase refrigerant flow. The uncertainty in measuring the area ratio using the instruments was within 4% full scale. The error in predicting the cross-sectional area ratio using the design tool was less than 6%.

Setting the flow restriction valve was based on the loss coefficient of the valve and the liquid flow rate through each tube in the mal-distributed case. The loss coefficient was determined for a particular valve using single phase pressure drop correlations. The conservation of momentum was applied to a component (e.g. valve) resulting in Equation 1.

$$\Delta P_{1F} = \xi \frac{\rho * V^2}{2g_c} \quad [1]$$

Where, $\Delta P_{1F}$ is the single-phase pressure drop (lb$_f$/ft$^2$)

$\xi$ is the single-phase loss coefficient (−)

$\rho$ is the density of the single phase fluid (lb$_m$/ft$^2$)

V is the velocity of flow (ft/s)

$g_c$ is the constant of proportionality for Newton's $2^{nd}$ Law (32.2 lb$_m$-ft/lb$_f$-s$^2$)

In this example, the loss coefficient was empirically demonstrated to be the same whether the flow was liquid or gas. The two-phase pressure drop was determined using single phase coefficient and Paliwoda's (reference 2) two-phase multiplier ($\beta_c$) and two phase pressure drop factor ($\vartheta$) using the correlation.

$$\Delta P_{2F} = \xi \frac{\dot{m}^{\circ 2}}{2\rho'' g_c} \beta_c \quad [2]$$

$$\beta_c = [\vartheta + C(1-\vartheta)x](1-x)^{0.333} + x^{2.276} \quad [3]$$

$$\vartheta = \frac{\Delta p'}{\Delta p''} = \frac{\rho''}{\rho'}\left(\frac{\eta'}{\eta''}\right)^{0.25} \quad [4]$$

Where, $\dot{m}$ is the mass flux (lb$_m$/ft$^2$)

$\eta'$ is the single-phase dynamic viscosity $\eta''$ is the two-phase dynamic viscosity x is vapor mass fraction (−)

C is an empirical coefficient

The input variables are mass flow rates of water ($\dot{m}_w$), and air ($\dot{m}_a$), pressure at the inlet to the manifold $P_{in}$, pressure drop across the manifold $\Delta P_{manifold}$, temperatures of air and water at the entrance of manifold, number of tubes, liquid flow rates through the tubes without restriction $$\sum_{i=1}^{tubes} \dot{m}_{i\_maldist\_water},$$

diameter of tubes and diameter at the inlet of the manifold and two-phase loss coefficient for the sudden expansion at the inlet.

The first step in the model is to estimate sudden expansion two-phase pressure drop at the inlet of the manifold. The single-phase pressure drop at the inlet can be determined based on average hydraulic diameter at the inlet of the manifold and the mass flux density of the two-phase mixture. The single-phase loss coefficient $\xi_{exp}$, can be obtained from a table of values given by Paliwoda (reference 2) based on the square of the ratio of diameters, $(d/D)^2$ where, d, is the inlet pipe diameter and D, is the manifold hydraulic diameter. The two-phase pressure drop is estimated by multiplying the single-phase pressure drop with a two-phase multiplier $\beta_{exp}$, Equation [3]. The pressure at the inlet to the $1^{st}$ heat exchanger tube is the difference of the pressure at the inlet and the two-phase pressure drop at the expansion.

The second step is to predict the two-phase pressure drop in the manifold. This can be determined by two-phase pressure drop correlation with a manifold loss coefficient using equation [2]. The single-phase loss coefficient across the manifold was determined experimentally by measuring the pressure drop across the manifold using water at a flow rate of 77 kg/hr, which translates to an average velocity of 26.75 in/s and Reynolds number 5,000. The manometer used for the measurement of the pressure drop in the manifold has an uncertainty 0.001 in $H_2O$.

The third step is to determine the parameters for each tube of the heat exchanger related to uneven flow distribution. Pressure at the inlet to each of the mini-heat exchanger tubes can be determined using Equations 6 and 7. Then, this pressure drop was used with Equation 5 to determine the two-phase loss coefficient, $C_{sec}$, which is a sub term in the two phase multiplier (see Equation 3).

$$\sum_{i=1}^{last} P_{in\_HX[i]} = \xi_{manifold} \cdot \beta_i \cdot \frac{\dot{m}_{uneven[i]}^\circ}{2 \cdot g_c \cdot \rho_{air[i]}} \quad [5]$$

$$\sum_{i=1}^{last-1} P_{in\_HX[i+1]} = P_{in\_HX[i]} - \frac{P_{in\_HX[1]} - P_{in\_HX[last]}}{tubes} \quad [6]$$

$$P_{in\_HX[1]} = P_{in} - \Delta P_{exp} \quad [7]$$

The mass flux density is based on the mass of both the fluids of the two phase flow at each tube. The area considered to calculate the mass flux density is the cross-sectional area of the heat exchanger tube. To determine $C_{sec}$ the air mass flow rates at each tube for uneven flow needed to be determined. Hence, there is one more variable than the equations required for the number of tubes. The extra variable can be addressed using mass balance for the air flow which equates the sum of mass of air at all tubes (calculated) to the mass of air at the inlet (measured).

The fourth step is to repeat step three and evaluate the even flow distribution parameters. Using the two phase loss coefficient, $C_{sec}$, this is a result from step three, $\xi_{tube}$ the single phase loss coefficient for each tube which is a function of restriction that causes even flow for each tube can be determined. On the other hand, using Equation 1, $\xi_{tube}$ can be experimentally determined using a single tube by varying restriction at the valve. Results showed that the single phase loss coefficient is same for the fluid whether it is air or water.

An empirical correlation for valve position as a function of $\xi_{tube}$ was measured. The data obtained which is shown as FIG. 13 were fitted with three different polynomial equations in a piece-wise manner as shown in equations 8 to 10.

$$\text{Valve position} = -2.6016 \cdot \xi_{[i]} + 8.9735 \text{ for } \xi < 1.16 \quad [8]$$

$$\text{Valve position} = 0.0019 \cdot \xi_{[i]}^2 - 0.1442 \cdot \xi_{[i]} 5.8411 \text{ for } 1.16 < \xi < 52.43 \quad [9]$$

$$\text{Valve position} = -0.0016 \cdot \xi_{[i]} + 3.582 \text{ for } 52.43 < \xi < 372.21 \quad [10]$$

Correction factor [K] was introduced in calculating even mass flow rate of air through each tube to limit the $\xi_{tube[j]}$ values within the valid range to determine the valve position between 0 and 9.

The fifth step is to calibrate the fluid flow restrictor. In this example, pinch valves were used. The pinched valves used for restriction were labeled with graduations. These graduations do not have any dimensional significance other than 9 is fully open and 2.8 is fully closed for ¼ inch ID (5/16 inch OD) flexible tube. Experimentation was developed to correlate the graduations to the area of restriction.

Using a simple experimental setup, the pinch valve was calibrated with a second degree polynomial correlation shown as equation 11 between graduation and cross-sectional area after restriction. The correlation is based on two sets of data collected separately to minimize the error. The developed correlation best fits the data with an R-Square ($R^2$) =0.9933.

$$\text{Cross-Sectional Area} = -0.0008 \cdot (vp)^2 + 0.0186 \cdot (vp) - 0.0488 \quad [11]$$

Where,
vp is the valve position.

The sixth step is to determine the zero offset values. In order to limit the valve settings within the fully open area in all cases, zero offsets [A=1.1024, B=1 and C=0.8975] were iteratively determined and used as multiples for the constant term of the cross-sectional area equation 11, for the valve position equations 8 to 10 respectively.

The seventh step is to determine a preferable restriction cross-sectional area of each tube. A cross-sectional area ratio of each tube is specified such that the fluid in the manifold at a specified operating condition is more evenly distributed. The area ratio is equal to the final area/fully open area. The final area is the area of the tube after restriction and the fully open area is the tube cross-sectional area at no restriction. In this example, the pinch valve was used to change the area ratio. An area ratio equal to one is fully open and zero is fully closed. The uncertainty in predicting the area ratio by the design tool using the instruments was within 4%.

In the foregoing description, certain terms have been used for brevity, clearness and understanding; but no unnecessary limitations are to be implied therefrom beyond the requirements of the prior art, because such terms are used for descriptive purposes and are intended to be broadly construed. Moreover, the description and illustration of the inventions is by way of example, and the scope of the inventions is not limited to the exact details shown or described.

Although the foregoing detailed description of the present invention has been described by reference to an exemplary embodiment, and the best mode contemplated for carrying out the present invention has been shown and described, it will be understood that certain changes, modification or variations may be made in embodying the above invention, and in the construction thereof, other than those specifically set forth herein, may be achieved by those skilled in the art without departing from the spirit and scope of the invention, and that such changes, modification or variations are to be considered as being within the overall scope of the present invention. Therefore, it is contemplated to cover the present invention and any and all changes, modifications, variations, or equivalents that fall with in the true spirit and scope of the underlying principles disclosed and claimed herein. Consequently, the scope of the present invention is intended to be limited only by the attached claims, all matter contained in the above description and shown in the accompanying drawings shall be interpreted as illustrative and not in a limiting sense.

Having now described the features, discoveries and principles of the invention, the manner in which the invention is constructed and used, the characteristics of the construction, and advantageous, new and useful results obtained; the new and useful structures, devices, elements, arrangements, parts and combinations, are set forth in the appended claims.

It is also to be understood that the following claims are intended to cover all of the generic and specific features of the invention herein described, and all statements of the scope of the invention which, as a matter of language, might be said to fall therebetween.

What is claimed is:

1. A method of improving the efficiency of heat transfer in a heat transfer apparatus, the method comprising the step of:
   restricting a flow of fluid to a predetermined amount in at least one tube extending from a manifold of the heat transfer apparatus;
   wherein in each tube that includes a fluid flow restrictor the predetermined amount is such that additional restriction is applied to a tube where there would otherwise be excess fluid flow, whereby a force which directs more fluid to enter one tube over another is countered.

2. The method of claim 1, wherein the predetermined amount is a function of the position of the tube along the manifold relative to the position of a fluid inlet of the manifold.

3. The method of claim 1, wherein each tube includes a fluid flow restrictor.

4. The method of claim 1, wherein a fluid flow restrictor for restricting the flow of fluid to the predetermined amount is selected from the group consisting of a tube restrictor valve, a tube crimp and a restriction tube segment, wherein the restriction tube segment has an inside diameter smaller than the inside diameter of a tube with no fluid flow restrictor.

5. The method of claim 1, further comprising the step of distributing the flow of fluid about evenly among a plurality of tubes.

6. The method of claim 1, wherein the fluid is liquid, vapor or some combination of both liquid and vapor.

7. The method of claim 1, wherein the fluid is a refrigerant.

8. The method of claim 1, wherein said predetermined amount is determined by a method comprising:
   estimating sudden expansion two-phase pressure drop at an inlet of a heat transfer apparatus manifold;
   predicting the two-phase pressure drop across the manifold;
   determining parameters for each tube of the apparatus related to an uneven fluid flow distribution;
   determining parameters for each tube related to an even flow distribution; and
   determining a preferable restriction cross-sectional area of each tube.

9. The method of claim 8, wherein the apparatus further comprises a fluid flow restrictor connected to at least one of the plurality of tubes, the method further comprising the steps of:
   calibrating a dimensionless position of each fluid flow restrictor to a restriction cross-sectional area of each respective tube; and
   determining zero offset values.

10. The method of claim 8, further comprising the step of: restricting the cross-sectional area of at least one tube to the preferable restriction cross-sectional area.

11. The method of claim 8, wherein said heat transfer apparatus comprises:
   a manifold and a plurality of tubes extending from the manifold;
   wherein the manifold comprises an inlet and a plurality of heat exchanger channels connected to the inlet, each heat exchanger channel being operably connected to one of the plurality of tubes; and
   wherein at least one tube includes a fluid flow restrictor.

12. The method of claim 1, wherein said heat transfer apparatus comprises:
   a manifold and a plurality of tubes extending from the manifold;
   wherein the manifold comprises an inlet and a plurality of heat exchanger channels connected to the inlet, each heat exchanger channel being operably connected to one of the plurality of tubes; and
   wherein at least one tube includes a fluid flow restrictor.

* * * * *